(12) United States Patent
Herbrandt et al.

(10) Patent No.: US 11,856,718 B2
(45) Date of Patent: Dec. 26, 2023

(54) HOUSING FOR A POWER SEMICONDUCTOR MODULE ARRANGEMENT

(71) Applicant: Infineon Technologies AG, Neubiberg (DE)

(72) Inventors: Alexander Herbrandt, Soest (DE); Philipp Bräutigam, Warstein-Hirschberg (DE); Andre Arens, Rüthen (DE); Marco Ludwig, Nordrhein-Westfalen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/070,849

(22) Filed: Nov. 29, 2022

(65) Prior Publication Data

US 2023/0180400 A1 Jun. 8, 2023

(30) Foreign Application Priority Data

Dec. 7, 2021 (EP) .................................... 21212681

(51) Int. Cl.
| | |
|---|---|
| *H05K 7/20* | (2006.01) |
| *H01L 23/40* | (2006.01) |
| *H05K 5/00* | (2006.01) |
| *H05K 5/02* | (2006.01) |
| *H01L 23/498* | (2006.01) |
| *H01L 23/00* | (2006.01) |
| *H01L 25/07* | (2006.01) |

(52) U.S. Cl.
CPC ....... *H05K 5/0026* (2013.01); *H01L 23/4006* (2013.01); *H05K 5/0247* (2013.01); *H05K 7/209* (2013.01); *H01L 23/49811* (2013.01); *H01L 24/48* (2013.01); *H01L 25/072* (2013.01); *H01L 2224/48225* (2013.01)

(58) Field of Classification Search
CPC .......................... H05K 7/0209; H01L 23/4006
See application file for complete search history.

(56) References Cited

U.S. PATENT DOCUMENTS

| | | | |
|---|---|---|---|
| 8,134,837 B2* | 3/2012 | Hohlfeld | ............. H01L 23/4006 174/16.3 |
| 2008/0080140 A1 | 4/2008 | Hsieh | |

(Continued)

*Primary Examiner* — Hung V Ngo
(74) *Attorney, Agent, or Firm* — Murphy, Bilak & Homiller, PLLC

(57) ABSTRACT

An arrangement includes a housing and a printed circuit board (PCB) arranged vertically above the housing. The housing includes: at least one protrusion attached to sidewalls and arranged on an outside of the housing at a lower end with at least one first through hole provided in the protrusion; holding devices each arranged inside a first through hole and/or between the PCB and the first through hole; and fastening elements configured to attach the housing to a heat sink or base plate. Each holding device is configured to clamp a corresponding fastening element such that the fastening elements are secured in defined positions, and to align each fastening element with a different first through hole. The PCB includes second through holes each arranged vertically above and aligned with a different fastening element. A diameter of each second through hole is less than the largest diameter of the respective fastening element.

14 Claims, 3 Drawing Sheets

(56) References Cited

U.S. PATENT DOCUMENTS

| | | | |
|---|---|---|---|
| 2008/0158822 A1* | 7/2008 | Stolze | H01L 23/4006 |
| | | | 257/E23.084 |
| 2008/0203559 A1 | 8/2008 | Lee et al. | |
| 2010/0091461 A1 | 4/2010 | Yamanaka | |
| 2016/0143187 A1 | 5/2016 | Sekino | |
| 2018/0042128 A1* | 2/2018 | Su | H05K 5/0217 |
| 2019/0304857 A1 | 10/2019 | Spann | |
| 2020/0058572 A1* | 2/2020 | Wu | H01L 23/32 |
| 2020/0068729 A1* | 2/2020 | Kim | H05K 5/0056 |
| 2022/0044984 A1* | 2/2022 | Reiter | H05K 1/18 |
| 2023/0187311 A1* | 6/2023 | Hori | H01L 24/48 |
| | | | 257/712 |

\* cited by examiner

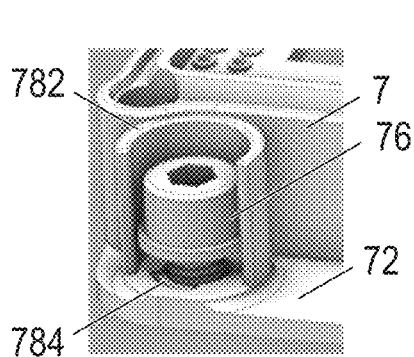
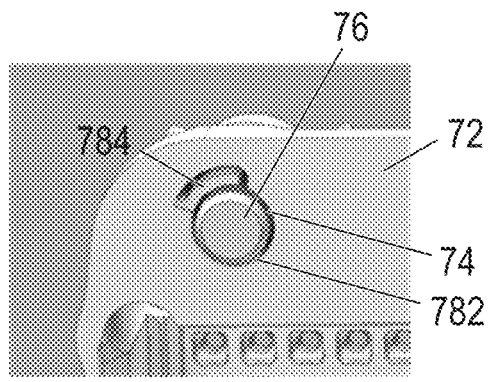
FIG 6A  FIG 6B
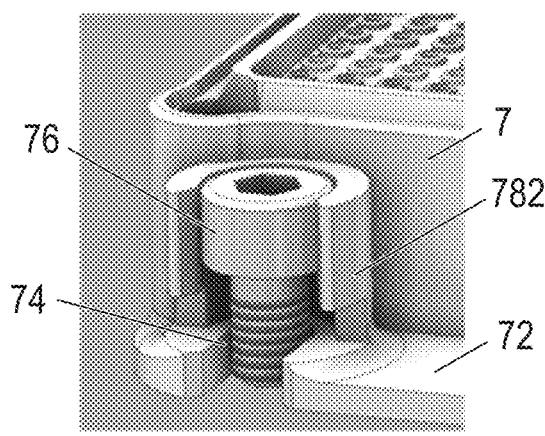
FIG 7
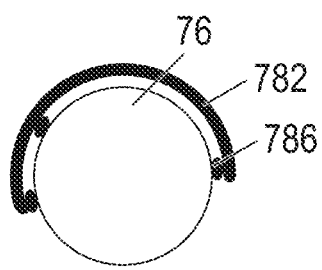
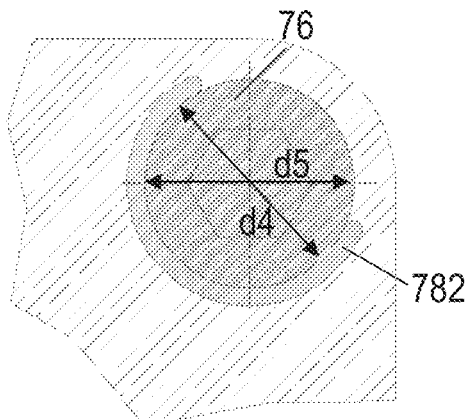
FIG 8  FIG 9

HOUSING FOR A POWER SEMICONDUCTOR MODULE ARRANGEMENT

TECHNICAL FIELD

The instant disclosure relates to a housing for a power semiconductor module arrangement, in particular to a housing comprising a mounting device for mounting the housing on a heat sink or base plate.

BACKGROUND

Power semiconductor module arrangements often include a substrate within a housing. The substrate usually comprises a substrate layer (e.g., a ceramic layer), a first metallization layer deposited on a first side of the substrate layer and, optionally, a second metallization layer deposited on a second side of the substrate layer. A semiconductor arrangement including one or more controllable semiconductor elements (e.g., two IGBTs in a half-bridge configuration) may be arranged on the substrate. One or more contact elements, which allow for contacting such a semiconductor arrangement from outside the housing, are usually provided. A printed circuit board may be arranged outside of the housing, which contacts the one or more contact elements. Different contact elements may be electrically coupled to each other by means of conducting tracks on the printed circuit board, for example. The housing may comprise protrusions on its outside. Through holes may be provided in the protrusions such that the housing can be mounted on a heat sink or a base plate by means of screws that are inserted through the through holes and screwed into respective boreholes provided in the heat sink or base plate. The printed circuit board provided outside of the housing, however, impedes the insertion of the screws into the boreholes and the fastening of the screws by means of suitable tools. Usually, large through holes have to be provided in the printed circuit board in order to be able to insert the screws into the boreholes. Therefore, valuable space on the printed circuit board which is needed for forming conducting tracks thereon is consumed by the through holes.

There is a need for a housing that can be easily mounted on a heat sink or base plate, while still allowing to provide sufficient space on a printed circuit board outside of the housing.

SUMMARY

An arrangement includes a housing and a printed circuit board arranged vertically above the housing, wherein the housing includes sidewalls, at least one protrusion attached to the sidewalls and arranged on the outside of the housing at a lower end of the housing distant from the printed circuit board, wherein at least one first through hole is provided in the at least one protrusion, a plurality of holding devices, wherein each holding device is arranged inside a first through hole and/or between the printed circuit board and a first through hole, and a plurality of fastening elements configured to attach the housing to a heat sink or base plate, wherein each of the plurality of holding devices is configured to clamp a different one of the fastening elements such that the fastening elements are secured in defined positions, and to align each of the fastening elements with a different one of the first through holes, the printed circuit board includes a plurality of second through holes, wherein each of the second through holes is arranged vertically above and aligned with a different one of the plurality of fastening elements, a diameter of each of the second through holes is less than the largest diameter of the respective fastening element, and when a defined force is exerted on the fastening elements, the fastening elements are configured to move vertically through the respective first through holes in a direction away from the printed circuit board.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

BRIEF DESCRIPTION OF THE DRAWINGS

FIGS. 6A and 6B schematically illustrate exemplary holding devices.

FIG. 7 is a dimensional view of an exemplary holding device.

FIG. 8 is a top view of an exemplary holding device.

FIG. 9 is a top view of another exemplary holding device.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not require the existence of a "first element" and a "second element". A semiconductor body as described herein may be made from (doped) semiconductor material and may be a semiconductor chip or may be included in a semiconductor chip. A semiconductor body has electrically connecting pads and includes at least one semiconductor element with electrodes.

Figure 1:
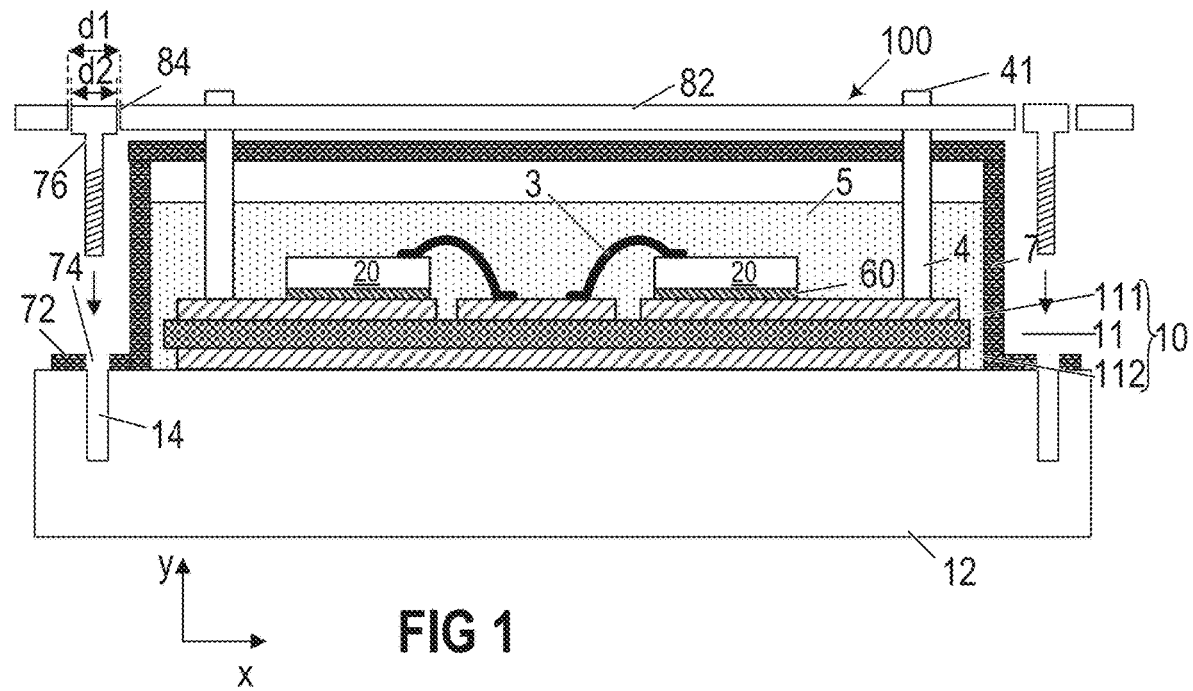
FIG. 1 is a cross-sectional view of a conventional power semiconductor module arrangement.

Referring to FIG. 1, a cross-sectional view of a power semiconductor module arrangement 100 is illustrated. The power semiconductor module arrangement 100 includes a housing 7 and a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials:

copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, AlN, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $SiO_2$, $Al_2O_3$, AlN, SiN or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. The housing 7 comprises sidewalls and, optionally, a cover. The substrate 10 and the housing 7 may be mounted on a heat sink or a base plate 12. The heat sink or base plate 12 may form a bottom of the housing 7, as is schematically illustrated in FIG. 1. This, however, is only an example. The housing 7 may also comprise a bottom that, when the housing 7 is arranged on the heat sink or base plate 12, is arranged between the substrate 10 and the heat sink or base plate 12. In some power semiconductor module arrangements 100, more than one substrate 10 is arranged within the same housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. According to another example, the second metallization layer 112 may be a structured layer. According to other examples, the second metallization layer 112 may also be omitted. The first metallization layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor bodies 20 may be mounted to the same or to different sections of the first metallization layer 111. Different sections of the first metallization layer may have no electrical connection or may be electrically connected to one or more other sections using electrical connections 3 such as, e.g., bonding wires. Semiconductor bodies 20 may be electrically connected to each other or to the first metallization layer 111 using electrical connections 3, for example. Electrical connections 3, instead of bonding wires, may also include bonding ribbons, connection plates or conductor rails, for example, to name just a few examples. The one or more semiconductor bodies 20 may be electrically and mechanically connected to the substrate 10 by an electrically conductive connection layer 60. Such an electrically conductive connection layer 60 may be a solder layer, a layer of an electrically conductive adhesive, or a layer of a sintered metal powder, e.g., a sintered silver (Ag) powder, for example.

The power semiconductor module arrangement 100 illustrated in FIG. 1 further includes terminal elements 4. The terminal elements 4 are electrically connected to the first metallization layer 111 and provide an electrical connection between the inside and the outside of the housing 7. The terminal elements 4 may be electrically connected to the first metallization layer 111 with a first end, while a second end 41 of the terminal elements 4 protrudes out of the housing 7. The terminal elements 4 may be electrically contacted from the outside at their second end 41. Such terminal elements 4, however, are only an example. The components inside the housing 7 may be electrically contacted from outside the housing 7 in any other suitable way. For example, terminal elements 4 may be arranged centrally on the substrate 10 or even closer to or adjacent to the sidewalls of the housing 7. It is also possible that one or more terminal elements 4 protrude vertically or horizontally through the sidewalls of the housing 7. The first end of a terminal element 4 may be electrically and mechanically connected to the substrate 10 by an electrically conductive connection layer, for example (not explicitly illustrated in FIG. 1). Such an electrically conductive connection layer may be a solder layer, a layer of an electrically conductive adhesive, or a layer of a sintered metal powder, e.g., a sintered silver (Ag) powder, for example. The first end of a terminal element 4 may also be electrically coupled to the substrate 10 via one or more electrical connections 3, for example. The second ends 41 of the terminal elements 4 may be mechanically and electrically connected to a printed circuit board 82. Conductor tracks (not specifically illustrated) may be provided on the printed circuit board 82, in order to electrically couple different ones of the terminal elements 4 with each other or to any other components that may be arranged on the printed circuit board 82. Such conductor tracks may comprise any suitable electrically conducting material such as, e.g., copper. According to one example, one or more terminal elements 4 are implemented as bonding wires.

The power semiconductor module arrangement 100 generally further includes an encapsulant 5. The encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 4 may be partly embedded in the encapsulant 5. At least their second ends 41, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged inside the housing 7, from certain environmental conditions and mechanical damage.

The housing 7 is mounted to the heat sink or base plate 12 by means of fastening elements 76. The fastening elements 76 may comprise screws, pins with or without thread, studs with or without thread, or rivets, for example. (Threaded)

bore holes 14 may be provided in the heat sink or base plate 12. The fastening elements 76 are inserted into the bore holes 14. The housing 7 comprises at least one protrusion 72 on its outside. The at least one protrusion 72 is attached to the sidewalls of the housing 7 at a lower end of the housing 7. The lower end of the housing 7 is the end of the housing 7 which is attached to the heat sink or base plate 12. The printed circuit board 82 is generally arranged close to an upper end of the housing 7 opposite the lower end and facing away from the heat sink or base plate 12. Protrusions 72 may be attached to the housing 72 in any suitable way. For example, protrusions 72 may be glued to the housing 7. It is also possible that the protrusions 72 are integrally formed with the housing 7. First through holes 74 are provided in the at least one protrusion 72. According to one example, one continuous protrusion 72 is provided along the entire circumference of the housing 7, wherein a plurality of first through holes 74 is formed in the protrusion 72. According to another example, two or more separate protrusions 72 are provided at different positions along the circumference of the housing 7, wherein one or more first through holes 74 are formed in each of the protrusions 72.

The fastening elements 76 may comprise an elongated body having a smaller diameter and a head having a diameter which is larger than the diameter of the elongated body. The diameter of the head is also larger than the diameter of the first through holes 74. When a fastening element 76, i.e., its elongated body, is inserted through one of the first through holes 74 and a respective bore hole 14 in the heat sink or base plate 12, its head remains vertically above the protrusion 72 and presses the protrusion, and therefore the housing 7, on the heat sink or base plate 12. In this way, the housing 7 can be securely attached to the heat sink or base plate 12. A housing 7 is usually mounted on a heat sink or base plate 12 by means of two or more fastening elements 76. In the arrangement of FIG. 1, the housing 7 does not contact the substrate 10. It is, however, also possible that the housing 7 contacts the substrate 10 and presses the substrate 10 on the heat sink or base 12 when the housing 7 is mounted on the heat sink or base plate 12. In this way, a satisfactory contact may be provided between the substrate 10 and the heat sink or base plate 12 in order to effectively conduct heat away from the substrate 10.

The power semiconductor arrangement 100 is usually mounted on the heat sink or base plate 12 when it is already completely assembled. That is, the housing 7 is mounted on the heat sink or base plate 12 when the housing 7 is closed and the printed circuit board 82 is already securely attached to the terminal elements 4. Therefore, second through holes 84 need to be provided in the printed circuit board 82 which allow to insert the fastening elements 76 through the first through holes 74 and into the bore holes 14 of the heat sink or base plate 12. Even further, a tool for inserting and fixing the fastening elements 76 in the bore holes 14 needs to pass through the second bore holes 84. A diameter d1 of the second through holes 84, therefore, in the arrangement of FIG. 1 is required to be larger than the largest diameter d2 of the fastening elements 76. The largest diameter d2 of the fastening elements 76 is usually the diameter of its head. The large second through holes 84, however, consume lots of space of the printed circuit board 82 which cannot be used for arranging conducting tracks or any other elements thereon.

Figure 2:
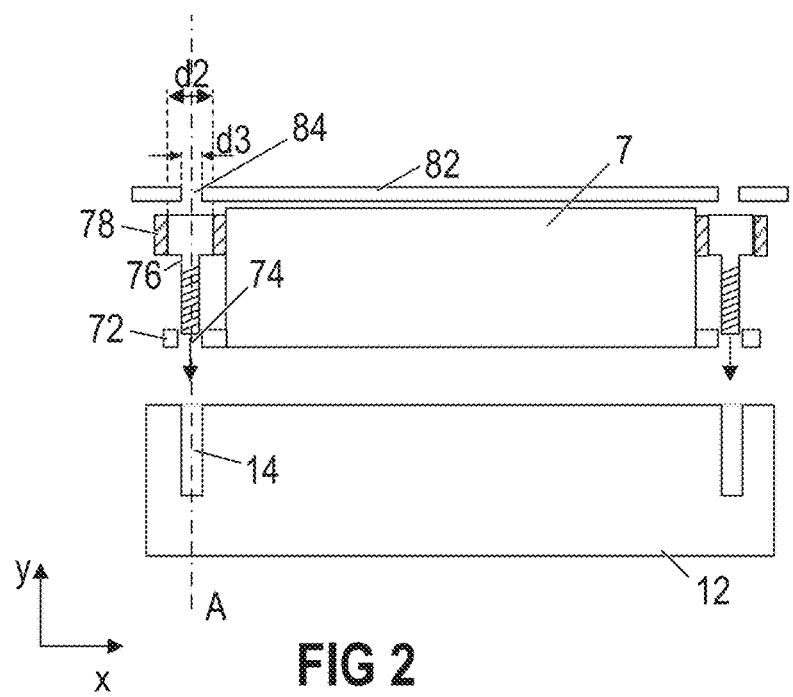
FIG. 2 is a cross-sectional view of a housing for a power semiconductor module arrangement according to one example.

Now referring to FIG. 2, a power semiconductor module arrangement 100 according to one example is schematically illustrated. The arrangement of FIG. 2 largely corresponds to the arrangement that has been described with respect to FIG. 1 above. The components arranged inside the housing 7 that have been described above are not specifically illustrated in FIG. 2. The housing 7 in the example of FIG. 2 comprises additional holding devices 78. Each of the holding devices 78 in this example is arranged between the printed circuit board 82 and a different one of the protrusions 72 in a vertical direction y. Each of the plurality of holding devices 78 is configured to clamp a different one of the fastening elements 76 such that the fastening elements 76 are secured in defined positions above the first through holes 72. That is, each of the plurality of fastening elements 76 is aligned with a different one of the first through holes 74. A fastening element 76 being aligned with a first through hole 74 means that a vertical axis A going through a center of the fastening element 76 corresponds to a vertical axis A going through the center of the respective first through hole 74. The vertical axis A is perpendicular to a top surface of the heat sink or base plate 12, wherein the top surface of the heat sink or base plate 12 is a surface on which the housing 7 is mounted. The fastening element 76 is further aligned with a respective one of the second through holes 84 in the printed circuit board 82.

The fastening elements 76 can be inserted into the holding devices 78 before the printed circuit board 82 is mounted on the housing 7. In some embodiments it is also possible to insert the fastening elements 76 into the holding devices 78 after the printed circuit board 82 has been mounted on the housing 7. In the latter case, the fastening elements 76 are inserted into the holding devices 78 horizontally through the second through holes 84 of the printed circuit board 82 (instead of vertically, as has been described with respect to the conventional arrangement of FIG. 1 above). The power semiconductor module arrangement 100 comprising the housing 7 and the printed circuit board 82 can then be sold and shipped together with the fastening elements 76 that are securely held in place by the holding devices 78. It is no longer necessary to insert the fastening devices 76 through the second through holes 84. The second through holes 84 in the arrangement of FIG. 2, therefore, may have a smaller diameter d3 as compared to the diameter d1 of the second through holes 84 of the arrangement of FIG. 1. The second through holes 84 usually cannot be completely omitted, as it may still be necessary to reach the fastening elements 76 with an appropriate tool to insert and fasten them in the bore holes 14. However, in the arrangement of FIG. 2, a diameter d3 of the second through holes 84 is smaller than the largest diameter d2 of the fastening elements 76. In this way, more of the area of the printed circuit board 82 is available for conducting tracks or any other components mounted on the printed circuit board 82. According to one example, the diameter d3 of the second through holes 84 is between 10% and 60% smaller than the largest diameter d2 of the fastening elements 76. For example, if the largest diameter d2 of the fastening element 76 is 8.3 mm (millimeter), the diameter d3 of the second through hole 84 may be between 4.6 and 5 mm, if a tool having a diameter of 4 mm is used to fix the fastening element 76 to the heat sink or base plate 12. The diameter d3 of the second through holes 84 may solely depend on a size of the tool, for example, in particular it may be larger than the diameter of the tool that is used in order to prevent the tool from damaging the printed circuit board 82 when mounting the housing 7 on the heat sink or base plate 12. In this way, up to 80% of the surface area of the second through holes 84 of FIG. 1 can be provided as available surface area of the printed circuit board 82 in FIG. 2.

In the example illustrated in FIG. 2, the holding devices 78 are arranged vertically above the protrusions 72. That is, the holding devices 78 are arranged between the protrusions 72 and the printed circuit board 82 along the sidewalls of the housing 7 in a vertical direction y. A holding device 78 of the arrangement of FIG. 2 is illustrated in greater detail in the detailed view of FIG. 4.

Figure 3:
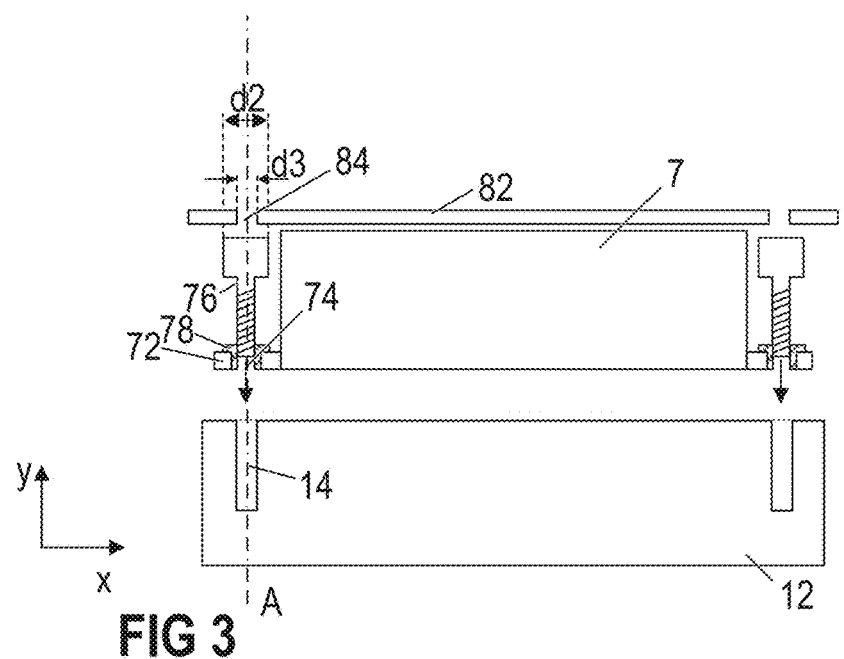
FIG. 3 is a cross-sectional view of a housing for a power semiconductor module arrangement according to another example FIG. 4 schematically illustrates a detail of the housing of FIG. 2 in greater detail.
Figure 5:
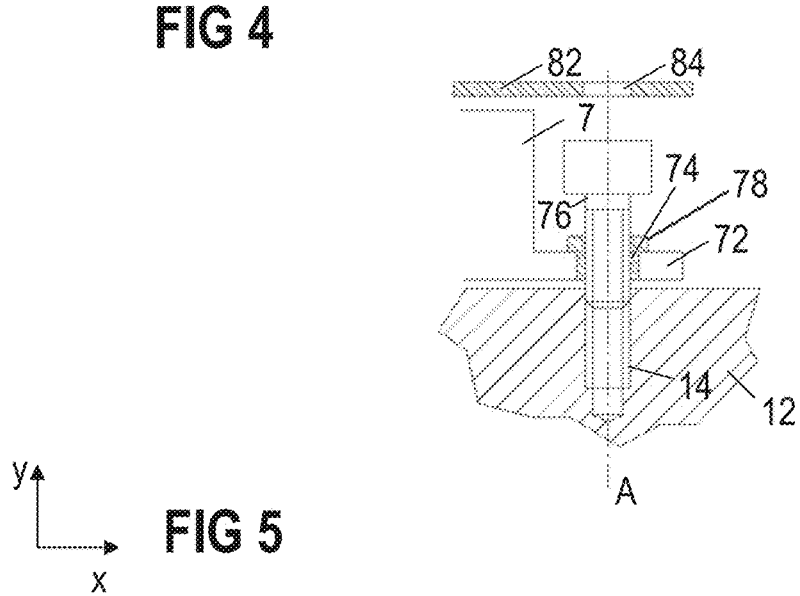
FIG. 5 schematically illustrates a detail of the housing of FIG. 3 in greater detail.

Now referring to FIG. 3, it is also possible to arrange the holding device 78 at least partly in the respective first through hole 74. In the example illustrated in FIG. 3, illustrated in greater detail in FIG. 5, one part of the holding device 78 is arranged in the first through hole 74, while another part of the holding device 78 is arranged above the protrusion 72, between the protrusion 72 and the printed circuit board 82.

The holding devices 78 can be implemented in many different ways. Several different examples of holding devices 78 will be described with respect to FIGS. 7 to 9 below.

Figure 4:
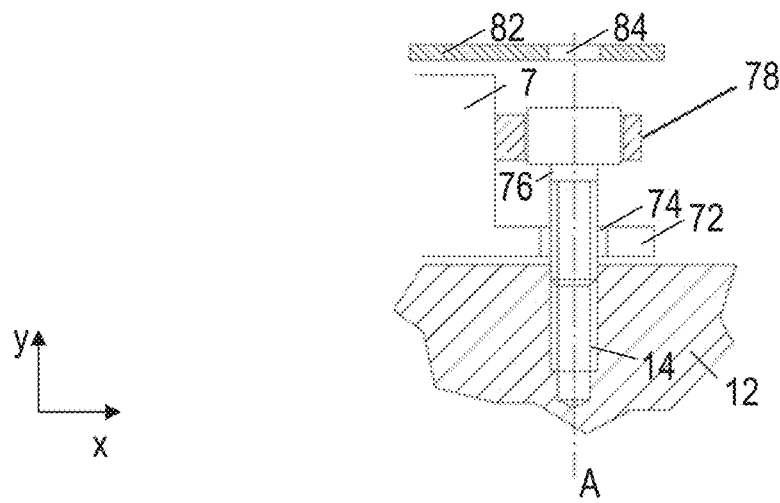

In order to securely hold the fastening device 76 in its desired position before it is inserted into the bore hole 14 in the heat sink or base plate 12, the holding device 78 clamps the respective fastening device 76. To achieve this clamping, the holding device 78 may contact the respective fastening element 76 in at least three different positions along a circumference of the fastening element 76. The fastening element 76 may either be clamped at its head, where it has the larger diameter, or anywhere along its elongated body, where it has the smaller diameter. In the arrangement illustrated in FIGS. 3 and 5, for example, the fastening element 76 is clamped along its elongated body, as the holding device 78 is arranged partly inside the first through hole 74. The head of the fastening element 76 is arranged above the protrusion 72 to be able to press the protrusion 72 against the heat sink or base plate 12 when the fastening element 76 is fully inserted in the bore hole 14. In this arrangement, therefore, clamping the fastening element 76 at its head is generally not reasonable. In the arrangement of FIGS. 2 and 4 on the other hand, the fastening element 76 may be clamped at its head. When inserting the fastening element 76 into the bore hole 14, the fastening element 76 is pushed out of its initial position by means of an appropriate tool and the head of the fastening element 76 moves towards the protrusion 72 such that, in a final mounting position in which the housing 7 is securely mounted on the heat sink or base plate 12, the head of the fastening element 76 contacts the protrusion 72 and presses it towards the heat sink or base plate 12.

The holding device 78, therefore, only exerts a certain minimum holding force on the fastening element 76, in order to hold it in its desired position. When a tool is used to insert and securely fasten the fastening element 76 in the bore hole 14, however, a force that is applied by the tool is greater than the holding force such that the fastening element 76 can be moved out of its initial position. The holding device 78 may contact the fastening element 76 in at least three different positions along its circumference. According to one example, the holding device 78 continuously contacts the fastening element 76 along its entire circumference.

According to one example, the holding device 78 comprises a threaded hole. The fastening element 76 in this example comprises a threaded elongated body that is inserted into the threaded hole of the holding device 78. The tool may be a screwdriver or a hexagon key, for example, which is configured to screw the fastening element 76 into the bore hole 14. At the same time, the fastening element 76 easily moves through the holding device 78 towards the heat sink or base plate 12. In this example, the holding device 78 may be partly inserted into the first through hole 74 of the protrusion 72, for example. It is also possible, for example, to arrange the holding device 78 between the protrusion 72 and the printed circuit board 82, the holding device 78 directly adjoining the protrusion 72.

According to another example, the holding device 78 comprises a sleeve 782 having a round cross-section. The sleeve 782 may extend continuously along its entire circumference. According to another example, however, the sleeve 782 comprises an interruption along its interference. That is, the sleeve 782 may extend along between 50% and 100% of its entire circumference, thereby forming a full circle, a semicircle or anything in between. Examples of sleeves 782 that comprise an interruption along their circumference are illustrated in FIGS. 6A to 9.

In the example illustrated in FIGS. 6A and 6B, the holding device 78 comprises a bracket 784 which presses the fastening element 76 against the sleeve 782. The bracket 784 may be arranged in the area along the circumference where the sleeve 782 is interrupted. The bracket 784 may be flexible. When the fastening element 76 is inserted into the holding device 78, the bracket 784 is moved out of an initial position. The bracket 784 applies a horizontal force on the fastening element 76, thereby pushing the fastening element 76 towards the sleeve 782 that is arranged opposite the bracket 784, as the bracket 784 tries to return to its initial position. According to one example, the bracket 784 and the sleeve 782 are integrally formed with the protrusion 72. FIG. 6A schematically illustrates a three-dimensional side-view, while FIG. 6B schematically illustrated a bottom view of the exemplary arrangement.

According to another example, and as is illustrated in FIGS. 7 and 9, a diameter d4 of the holding element 78 (the sleeve 782) is the same as or even slightly less than a diameter d5 of the fastening element 76. In the example illustrated in FIGS. 7 and 9, the diameter d4 of the sleeve 782 is slightly smaller than the diameter d5 of the head of the fastening element 76. In this way, the fastening element 76 can be securely held in its desired position. However, by applying a force (e.g., a vertical force) that is larger than the holding force, the fastening element 76 may be moved out of its initial position and towards the heat sink or base plate 12. According to one example, the holding element 78 (e.g., the sleeve 782 as illustrated in FIG. 7) is not only configured to clamp the fastening element 76, but may also be configured to extend a creepage distance between the fastening element 76 and any other elements of a power semiconductor module arrangement.

Now referring to FIG. 8, it is also possible that the diameter of the sleeve 782 is larger than the diameter of the fastening element 76 (diameter of the head or diameter of the elongated body, depending on where the holding device 78 is arranged). At least three nubs 786 may be arranged along the circumference of the sleeve 782 between the sleeve 782 and the fastening element 76. The nubs 786 reduce the diameter of the sleeve 782 in certain positions, thereby exerting a holding force on the fastening element 76 and holding it in its desired position. The nubs 786 may be formed of a comparably soft material that is compressible to a certain degree.

Several different examples of holding devices 78 have been explained above. However, the holding devices 78 may be implemented in any other suitable way.

The arrangement may comprise two or more holding devices 78. In order to securely mount a housing 7 on a heat sink or base plate 12, at least two fastening elements 76 are generally needed at different positions along the circumference of the housing 7. According to one example, the arrangement comprises four holding devices 78 and four fastening element 76, one at each corner of a square or rectangular housing 7.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An arrangement, comprising:
   a housing; and
   a printed circuit board arranged vertically above the housing,
   wherein the housing comprises:
   sidewalls;
   at least one protrusion attached to the sidewalls and arranged on an outside of the housing at a lower end of the housing distant from the printed circuit board, at least one first through hole being provided in the at least one protrusion;
   a plurality of holding devices, each holding device being arranged inside a first through hole and/or between the printed circuit board and the first through hole; and
   a plurality of fastening elements configured to attach the housing to a heat sink or base plate,
   wherein each of the plurality of holding devices is configured to clamp a different one of the fastening elements such that the fastening elements are secured in defined positions, and to align each of the fastening elements with a different one of the first through holes,
   wherein the printed circuit board comprises a plurality of second through holes, each of the second through holes being arranged vertically above and aligned with a different one of the plurality of fastening elements,
   wherein a diameter of each of the second through holes is less than a largest diameter of the respective fastening element,
   wherein when a defined force is exerted on the fastening elements, the fastening elements are configured to move vertically through the respective first through holes in a direction away from the printed circuit board.

2. The arrangement of claim 1, wherein each of the holding devices contacts the respective fastening element in at least three different positions along a circumference of the fastening element.

3. The arrangement of claim 2, wherein each of the holding devices contacts the respective fastening element continuously along the entire circumference.

4. The arrangement of claim 1, wherein each of the fastening elements comprises a screw, a pin with or without thread, a stud with or without thread, or a rivet.

5. The arrangement of claim 1, wherein each of the fastening elements comprises an elongated body and a head, wherein a diameter of the head is larger than a diameter of the elongated body, and wherein the largest diameter of a fastening element is the diameter of the head.

6. The arrangement of claim 1, wherein each of the holding devices comprises a sleeve.

7. The arrangement of claim 6, wherein each of the holding devices comprises at least three nubs along a circumference of the sleeve, wherein the at least three nubs are arranged between the sleeve and the respective fastening element.

8. The arrangement of claim 6, wherein a diameter of the sleeve is equal to or less than a diameter of the fastening element.

9. The arrangement of claim 6, wherein each of the holding devices further comprises a bracket which presses the respective fastening element against the sleeve.

10. The arrangement of claim 6, wherein the sleeve is at least partly arranged inside or integrally formed with one of the first through holes.

11. The arrangement of claim 6, wherein the sleeve forms a threaded hole.

12. The arrangement of claim 6, wherein the sleeve comprises an interruption along a circumference of the sleeve.

13. The arrangement of claim 1, wherein the diameter of each of the second through holes is between 10% and 60% smaller than the largest diameter of each of the respective fastening element.

14. The arrangement of claim 1, further comprising a plurality of terminal elements arranged inside the housing, wherein a first end of each of the plurality of terminal elements protrudes out of the housing and is mechanically and electrically connected to the printed circuit board.

* * * * *